United States Patent
Chen et al.

(10) Patent No.: US 10,896,707 B2
(45) Date of Patent: Jan. 19, 2021

(54) SELECTIVE CLOCK ADJUSTMENT DURING READ AND/OR WRITE MEMORY OPERATIONS

(71) Applicant: Arm Limited, Cambridge (GB)

(72) Inventors: Andy Wangkun Chen, Austin, TX (US); Rahul Mathur, Austin, TX (US); Cyrille Nicolas Dray, Antibes (FR); Yann Sarrazin, Sophia Antipolis (FR); Julien Vincent Poitrat, Mougins (FR); Yannis Jallamion-Grive, Mouans Sartoux (FR); Pranay Prabhat, Cambridge (GB); James Edward Myers, Bottisham (GB); Graham Peter Knight, Cambridge (GB); Jonas Švedas, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/290,822

(22) Filed: Mar. 1, 2019

(65) Prior Publication Data
US 2020/0194047 A1    Jun. 18, 2020

Related U.S. Application Data

(60) Provisional application No. 62/780,885, filed on Dec. 17, 2018.

(51) Int. Cl.
*G11C 8/00* (2006.01)
*G11C 11/00* (2006.01)
*G11C 11/16* (2006.01)

(52) U.S. Cl.
CPC ......... *G11C 11/005* (2013.01); *G11C 11/161* (2013.01); *G11C 11/1659* (2013.01); *G11C 11/1675* (2013.01)

(58) Field of Classification Search
CPC ............... G11C 11/1659; G11C 11/005
See application file for complete search history.

(56) References Cited

U.S. PATENT DOCUMENTS

| 9,036,444 B1 * | 5/2015 | Silberman | G06F 11/073 365/226 |
|---|---|---|---|
| 2009/0316494 A1 * | 12/2009 | Uehara | G11C 7/1006 365/189.05 |
| 2012/0155160 A1 * | 6/2012 | Alam | G11C 7/1042 365/158 |

\* cited by examiner

*Primary Examiner* — Uyen Smet
(74) *Attorney, Agent, or Firm* — Pramudji Law Group PLLC; Ari Pramudji

(57) ABSTRACT

Briefly, embodiments of claimed subject matter relate to adjusting, such as extending, a clock signal to permit completion of a write operations to a first memory type and/or to permit completion of read operations from a second memory type, wherein the first memory type and the second memory type are dissimilar from each other. In certain embodiments, the first memory type may comprise a magnetic random-access memory (MRAM) cell array, and the second memory type may comprise a static random-access memory (SRAM) cell array.

18 Claims, 3 Drawing Sheets

SELECTIVE CLOCK ADJUSTMENT DURING READ AND/OR WRITE MEMORY OPERATIONS

CROSS-REFERENCE TO RELATED APPLICATIONS

This application claims the benefit of and priority to U.S. provisional patent application Ser. No. 62/780,885, filed 2018 Dec. 17 and titled SELECTIVE CLOCK ADJUSTMENT DURING READ AND/OR WRITE MEMORY OPERATIONS, the entire disclosure of which is herein incorporated by reference.

GOVERNMENT LICENSE RIGHTS

This invention was made with government support under Agreement No. HR0011-17-9-0025, awarded by DARPA. The government has certain rights in the invention.

TECHNICAL FIELD

This disclosure relates to circuits and methods for performing computer memory read and/or write operations.

BACKGROUND

In a computing device, which may include devices such as general purpose hand-held computers, gaming devices, communications devices, smart phones, embedded or special-purpose computing systems, memory devices may be utilized to store instructions, for example, for use by one or more processors of the computing device. Such computing devices may utilize various memory technologies, such as six-transistor static random-access memory (SRAM) cells, to store instructions executable by a processor and/or to store any results of such execution. In such memory devices, a binary logic value of "1," or a binary logic value of "0," may be determined at a bit line of a SRAM cell in response to a voltage being applied to the gate of one or more access transistors of the six-transistor SRAM cell.

Other types of memory devices may also be utilized in the above-identified computing devices, such as magnetic random-access memory (MRAM) cells, which may store a binary logic value of "1," or a binary logic value of "0," based on an orientation of magnetization vectors at a localized portion of a MRAM cell. For example, in certain types of MRAM cells, responsive to magnetization vectors comprising orientations parallel to each other, a relatively low resistance may be measured. Conversely, responsive to magnetization vectors of a MRAM cell comprising orientations antiparallel to each other, a relatively high resistance may be measured. Accordingly, by way of sensing whether a MRAM cell exhibits a relatively high resistance or a relatively low resistance, contents of the MRAM cell may be determined.

However, at times, reading parameters, such as executable instructions and/or results of processing executable instructions, from a SRAM cell may consume a period of time greater than a clock cycle, or other allotted duration, utilized by a processor of the computing device. In such instances, the frequency of a clock utilized by a processor of the computing device may be decreased, which may permit completion of a read operation from a SRAM cell during, for example, a single clock cycle. In other instances, such as those that involve performing write operations to MRAM cells, a similar situation may occur in which the write operation may consume a period of time greater than a clock cycle utilized by a processor of the computing device. Thus, in such instances, the frequency of a clock utilized by a processor of the computing device may be similarly decreased, which may permit completion of the write operation to the MRAM cell during, for example, the single clock cycle.

However, it may be appreciated that reducing a clock frequency for substantial periods of time during the operation of the computing device may bring about unacceptably slow performance of the computing device. Thus, it may also be appreciated that reducing a clock speed only during selected intervals, while maintaining operational speed during other intervals, continues to be an active area of investigation.

BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, or apparatuses described herein.

Figure 1:
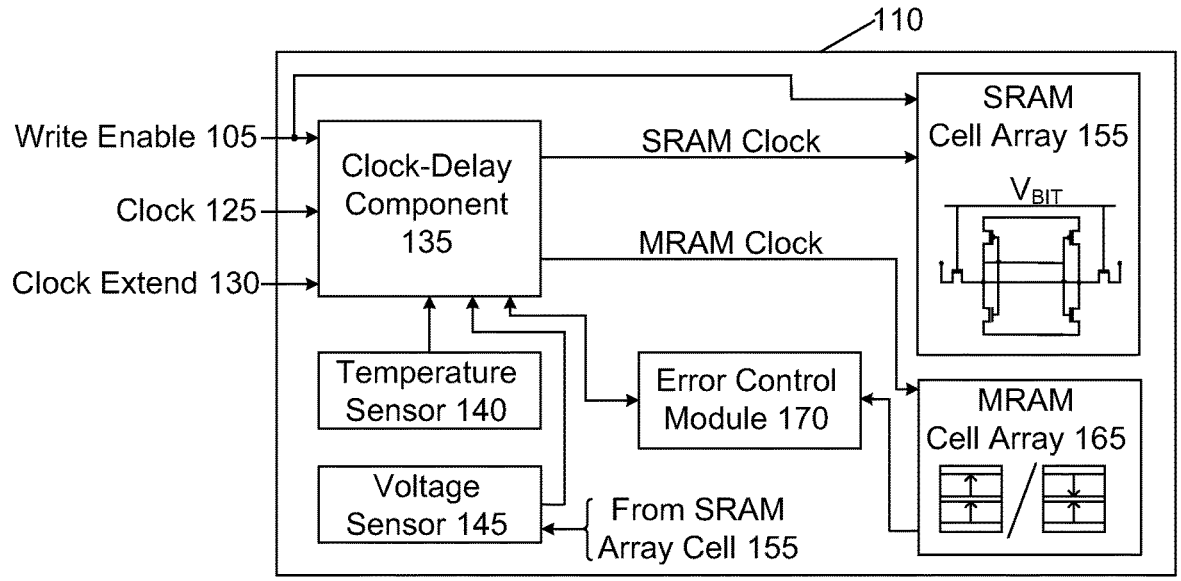
FIG. 1 is a block diagram of a circuit to adjust a clock signal during a memory read and/or during a memory write operation according to various embodiments.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

As previously mentioned, in a portable computing device, which may include devices such as general purpose and/or hand-held computers, gaming devices, communications devices, smart phones, and so forth, memory devices may be utilized to store instructions, for example, for use by one or more processors of the computing device. Additionally, memory devices may be utilized to store results of execution of such instructions by the one or more processors. To bring about these capabilities, a computing device may utilize various memory technologies, such as six-transistor static random-access memory (SRAM) cells, to store executable instructions as well as to store any results of such execution. In these memory devices, a binary logic value of "1," or a binary logic value of "0," may be determined at a bit line of a SRAM cell in response to a voltage being applied to the gate of one or more access transistors of the six-transistor SRAM cell.

However, under certain conditions, such as operation of a portable computing device at relatively low voltages, reading contents of a SRAM cell may consume a time period that may extend beyond a single clock cycle or other allotted duration. Thus, under such low-voltage conditions, reading contents of an array of SRAM cells may give rise to an increased number of errors in parameters, for example, read from the SRAM cells. Accordingly, to avoid such increases in errors encountered responsive to reading content from the array of SRAM cells, a clock signal may be adjusted so as to permit complete and relatively error-free reading of SRAM cells. However, it may be appreciated that, at least in some instances, indiscriminate increases in durations of individual clock cycles of the computing device may bring about delays in processing parameters, or other types of content, obtained from an array of SRAM cells. Such delays in processing of content read from SRAM cells may be unacceptable to even the most patient users of portable computing devices.

In addition to utilizing an array of SRAM cells, a computing device may additionally utilize an array of MRAM cells, which may store binary logic values of "1" or "0" responsive to a magnetization vector of a first localized portion of a MRAM cell relative to a magnetization vector of a second portion of the MRAM cell. When magnetization vectors of first and second portions of a MRAM cell are oriented parallel to each other, a relatively low resistance may be exhibited, which may indicate storage of, for example, a binary logic value of "0." Magnetization vectors of first and second portions of a MRAM cell oriented antiparallel to each other may exhibit a relatively high resistance, which may indicate, for example, a binary logic value of "1." Accordingly, via sensing of resistance, individual cells of a MRAM cell array, contents of a MRAM cell array may be determined.

However, particularly during low-temperature operation of an array of MRAM cells, such reorientation of magnetization vectors of localized portions of MRAM cells may consume a period of time greater than, for example, a single clock cycle utilized by a processor of the computing device. Thus, to maintain an acceptably low error rate during memory write operations, an individual clock cycle may be increased so as to permit complete and relatively error-free writing to MRAM cells. However, it may be appreciated that, at least in some instances, unchecked increases in the duration of individual clock cycles may bring about delays in processing operations involving storage of binary logic values in a MRAM cell array. Such delays in storing binary logic values by a MRAM cell array may represent a source of consternation among users of portable computing devices.

However, in embodiments of claimed subject matter, portable computing devices utilizing dissimilar types of memory elements, such as SRAM memory cell arrays and MRAM memory cell arrays, may operate in a manner in which read/write operations bring about only minimal reductions in processing speed. Accordingly, embodiments of claimed subject matter may permit expeditious reading of, for example, bit cells implemented using SRAM arrays, even under low-voltage operating conditions, such as bit cell read voltages of between 0.3 V and 0.6 V. Additionally, with respect to utilizing a memory type dissimilar to an array of SRAM cells, such as MRAM cells, embodiments of claimed subject matter may additionally permit MRAM write operations, even under low-temperature conditions. Such MRAM write operations may be conducted in a manner that does not bring about significant reductions in processing speed. Further, although embodiments disclosed herein may refer to use of MRAM cells, which may represent a memory technology that is dissimilar to SRAM cells, claimed subject matter is intended to embrace selective clock adjustment to permit read and/or write operations involving other dissimilar memory technologies, virtually without limitation.

In addition, an amount of clock adjustment during memory operations, such as while reading from cells of a SRAM array during low-voltage operation and/or while writing to cells of a MRAM array during low-temperature operation, may be configurable by a user of the particular memory devices. Such configurability may be brought about by dynamically providing a signal to as few as two pins of a target system-on-a-chip (SOC). Accordingly, to ensure completion of SRAM read operations and/or MRAM write operations without giving rise to unnecessary delays in processing operations, an amount of clock adjustment may be incrementally reduced, so as to permit completion of memory operations without unnecessarily extending a duration of such operations.

Before discussing embodiments in reference to the accompanying figures, a brief description of various non-limiting embodiments is provided. For example, in one embodiment, a circuit may comprise a first memory cell, such as a MRAM cell, and a second memory cell, such as a SRAM cell. The circuit may further comprise a clock-delay component having an output node coupled to the first memory cell and to the second memory cell, wherein the clock delay component may be configured to adjust a clock signal to bring about writing to the first memory cell and/or to adjust a clock signal to bring about reading from the second memory cell. In embodiments, the first memory cell type and the second memory cell type may be dissimilar to each other. The MRAM cell may comprise a spin-transfer torque (STT) device, although claimed subject matter is not limited in this respect.

In another embodiment, the above-described circuit may comprise a temperature sensor, which may include an output signal port coupled to an input signal port of the clock-delay component, which may operate to increase a clock-delay duration responsive to the temperature sensor measuring a temperature lower than a threshold value. Accordingly, as an operating temperature of the above-described circuit increases, a clock-delay duration may decrease, which may thereby avoid unnecessarily delaying memory operations as temperature increases. In an embodiment, the above-described circuit may comprise a voltage sensor configured to determine that a voltage at an input node of the second memory type is less than a threshold voltage. A clock-delay component may be configured to provide an output signal to adjust a clock signal during reading from the second memory cell, which may comprise a SRAM cell. In an embodiment, a clock-delay component may be configured to provide an output signal to delay the clock signal during writing to the first memory cell, which may comprise a MRAM cell, by two or more clock periods derived from a clock input node of the circuit. A circuit may additionally comprise one or more control signal inputs, which may be configured to set the delay of the clock signal during writing to the first memory cell. A circuit may additionally comprise one or more control signal inputs configured to set the delay of the clock signal during reading of the second memory cell.

In yet another embodiment, a circuit may comprise a first clock-delay component having an output node coupled to a MRAM cell, wherein the clock-delay component may be configured to adjust a clock signal, wherein the clock signal is to permit completion of a writing operation to the MRAM cell. The clock-delay component may comprise an input node to obtain a signal from a temperature sensor to indicate when a temperature of the MRAM cell is less than a lower threshold. The clock-delay component may comprise an input node to dynamically increment the adjustment of the clock signal. The input node to dynamically increment the adjustment of the clock signal may be configured to receive a signal from a temperature sensor to indicate when a temperature of the MRAM cell is greater than a lower threshold. A MRAM cell may comprise a spin-transfer torque device, at least in particular embodiments. In particular embodiments, the circuit may comprise a second clock-delay component having an output node coupled to a SRAM cell, wherein the second clock-delay component is configured to permit completion of a reading operation from the SRAM cell.

In yet another embodiment, a method of performing a memory operation may comprise determining whether the memory operation corresponds to writing to a MRAM cell or comprises reading from a SRAM cell. The method may further comprise delaying a clock signal to permit completion of the memory operation responsive to the determining. The method may additionally comprise obtaining a signal from a temperature sensor and determining a delay increment of the clock signal responsive to determining that the memory operation corresponds to writing to a MRAM cell. The method may additionally comprise determining a delay increment of the clock responsive to determining that the memory operation corresponds to reading from a SRAM cell and to determining that a bit cell access voltage is lower than a threshold value. The method may additionally comprise obtaining a signal from an error detection circuit, wherein the signal from the error detection circuit indicates that a previous writing operation to a MRAM cell has failed. Responsive to receipt of the signal from an error detection circuit, a subsequent clock signal may be delayed so as to permit completion of subsequent writing operations to MRAM cells.

Particular embodiments will now be described with reference to the figures, such as FIG. 1, which is a block diagram 100 of a circuit to adjust a clock signal during a memory read and/or a memory write operation according to various embodiments. As shown in diagram 100, circuit 110 may receive write enable signal 105, clock signal 125, and clock extend signal 130. Responsive to receipt of write enable signal 105, clock-delay component 135 may be placed into a state that permits component 135 to adjust clock signal 125. In an embodiment, write enable signal 105 comprises an active low signal. Accordingly, when write enable signal 105 comprises a binary logic value of "0," so as to indicate that a write operation is to occur, clock-delay component 135 may be configured to generate an adjusted (e.g., extended) version of clock signal 125 to permit writing to MRAM cell array 165. Thus, under such conditions, MRAM clock signal from clock-delay component 135 may comprise a signal devoid of rising and/or falling clock edges, so as to permit writing of binary digital values into MRAM cell array 165. In contrast, under such conditions, SRAM clock signal from clock-delay component 135 may comprise a waveform substantially identical to clock signal 125, which is applied to an input node of clock-delay component 135.

Conversely, when write enable signal 105 comprises a binary logic value of "1," so as to indicate that a read operation is to occur, clock-delay component 135 may be configured to couple an adjusted (e.g., extended) version of clock signal 125 to permit reading from SRAM cell array 155. Thus, under such conditions, SRAM clock signal from clock-delay component 135 may comprise a signal devoid of rising and/or falling clock edges, so as to permit reading of binary digital values from SRAM cell array 155. In contrast, under such conditions, MRAM clock signal from clock-delay 135 may comprise a waveform substantially identical to clock signal 125 applied to an input node of clock-delay component 135.

Thus, it may be appreciated that circuit 110 may be configured to provide an adjusted clock signal, which may permit reading of binary digital values from SRAM cell array 155, while providing a signal substantially identical to clock signal 125 to an input port of MRAM cell array 165. Accordingly, during selected intervals, additional time may be provided to conduct reading operations from SRAM cell array 155. Such additional time may be beneficial, at least in particular embodiments, during instances of relatively low values of voltage $V_{BIT}$, which may give rise to a relatively slow accumulation of bit-line voltages of six-transistor SRAM cells. Additionally, during other intervals, circuit 110 may adjust (e.g. extend) time allotted for writing of binary digital values to MRAM cell array 165, while providing a signal substantially identical to clock signal 125 to an input port of SRAM cell array 155. In certain embodiments, permitting additional time to perform writing operations to MRAM cell array 165 may enable magnetization vectors of individual cells of MRAM cell array 165 to be reoriented, for example, so as to permit retention of binary logic values by MRAM cell array 165.

Accordingly, circuit 110 may facilitate performing reading operations from, and performing writing operations to, dissimilar memory types, such as six-transistor SRAM cells of SRAM cell array 155 and STT MRAM cells of MRAM cell array 165. In this context, "dissimilar" memory types is defined as referring to memory types in which differing physical phenomena is utilized to store parameters, wherein such parameters may comprise one or more binary logic values of "0" and one or more binary logic values of "1." Thus, in one example, a SRAM cell array may comprise SRAM cells, which include CMOS inverter pairs that operate to retain a binary logic value at a first node of the CMOS inverter pair while retaining a complement of the binary logic value at a second node of the CMOS inverter pair. A memory type dissimilar from a SRAM cell array may comprise an MRAM cell array, such as cells of STT MRAM, which store binary logic values depending on a high-resistance or low-resistances state of STT MRAM cells.

As shown in diagram 100, circuit 110 comprises temperature sensor 140, which may operate to measure a temperature at a location at least proximate to MRAM cell array 165.

Thus, in certain embodiments, responsive to temperature sensor 140 measuring a relatively low temperature value or a temperature value less than a lower threshold, such as 0.0° C. (32.0° F.), temperature sensor 140 may signal clock-delay component 135 to adjust (e.g., extend) a rising edge and/or a falling edge of a clock signal from clock-delay component 135. Responsive to temperature sensor 140 measuring a temperature value greater than a different threshold (e.g., an upper threshold), such as 25.0° C. (77.0° F.), temperature sensor 140 may signal clock-delay component 135 to adjust (e.g., reduce) an amount of delay of a rising edge and/or a falling edge of a clock signal derived from clock signal 125. In particular embodiments, a capability for temperature sensor 140 to signal clock-delay component 135 may permit component 135 to adjust (e.g., extend) rising and/or falling edges of clock signal 125 by as many as 16 clock cycles although claimed subject matter is not limited in this respect. Such an ability to extend rising edges and/or falling edges of a clock signal derived from clock signal 125 responsive to increases or decreases in an ambient temperature may permit operation of MRAM cell array 165 under very cold conditions, such as conditions well below 0.0° C. (32.0° F.).

Circuit 110 additionally comprises voltage sensor 145, which may operate to measure a voltage, such as a voltage applied to $V_{BIT}$ of SRAM cell array 155. Thus, in certain embodiments, responsive to voltage sensor 145 measuring a relatively low voltage for $V_{BIT}$ of SRAM cell array 155, such as 0.3 V or 0.4 V, for example, voltage sensor 145 may signal clock-delay component 135 to adjust (e.g., extend) a clock signal from clock-delay component 135. Responsive to voltage sensor 145 measuring a somewhat higher voltage value, such as 0.6 V or 0.7 V, voltage sensor 145 may signal clock-delay component to adjust (e.g., reduce) an amount of delay of a rising edge and/or a falling edge of a clock signal derived from clock signal 125. In particular embodiments, a capability for voltage sensor 145 to signal clock-delay component 135 may permit component 135 to adjust (e.g., extend) rising and/or falling edges of clock signal 125 by as many as 16 clock cycles. Such an ability to extend rising and/or falling edges of a clock derived from clock signal 125 responsive to increases or decreases in $V_{BIT}$ of SRAM cell array 155 may permit operation of SRAM cell array 155 under a variety of voltage ranges.

In particular embodiments, circuit 110 may comprise error control module 170, which may operate to detect and/or correct errors in binary logic values written to MRAM cell array 165. Thus, in certain embodiments, error control module 170 may store a copy of certain binary logic values written to MRAM cell array 165. Error control module 170 may, at least occasionally, read from particular locations of the MRAM cell array 165 so that a comparison may be made between binary logic values stored within error control module 170 and within MRAM cell array 165. In response to error control module 170 detecting greater than a threshold number (or percentage) of errors responsive to such comparisons, error control module 170 may signal clock-delay component 135 to adjust (e.g., extend) rising edges and/or falling edges of clock signal 125. Such adjusting of rising edges and/or falling edges of clock signal 125 may bring about more reliable writing operations conducted by MRAM cell array 165 by allowing additional time for reorienting of magnetization vectors, for example, within individual cells of MRAM cell array 165.

Figure 2:
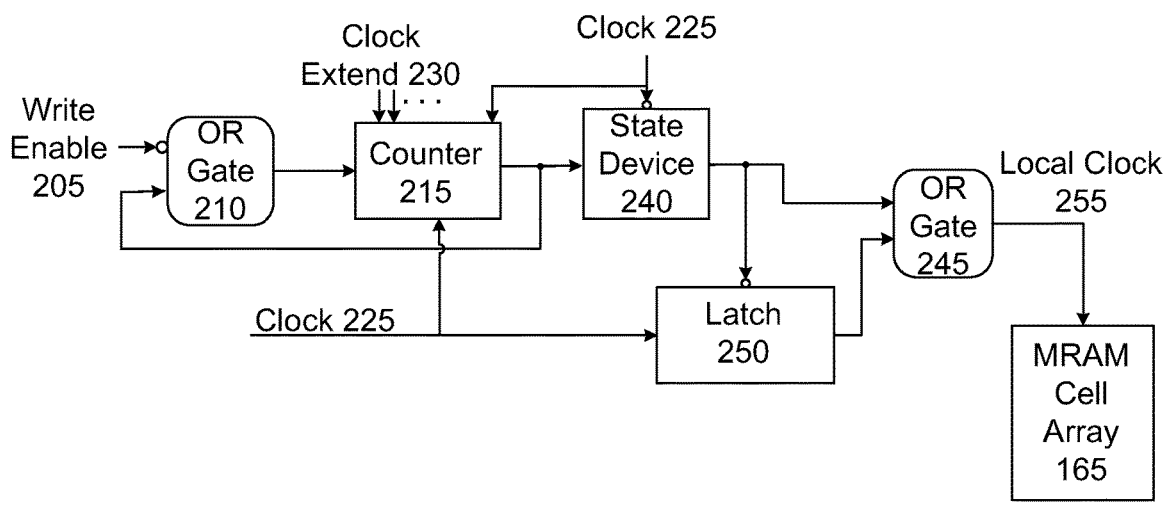
FIG. 2 is a diagram showing components of a circuit to adjust a clock signal during memory write operations according to various embodiments.

FIG. 2 is a diagram 200 showing components of a circuit to adjust a clock signal during memory write operations according to various embodiments. It may be appreciated that diagram 200 may perform at least some operations similar to those performed by circuit 110 depicted in diagram 100. The circuit of diagram 200 may obtain clock signal 225, which may be adjusted (e.g., extended) so as to generate local clock signal 255 responsive to an appropriate state of write enable signal 205. In operation, responsive to write enable signal 205 comprising a relatively low signal level (e.g., a binary logic value of "0"), the circuit of diagram 200 may be placed into a memory write mode, for example, such as a mode suitable for writing to MRAM cell array 165 of FIG. 1. In the embodiment of FIG. 2 (diagram 200) clock extend signal 230 may be coupled to an input node of counter 215. In one embodiment, clock extend signal 230 comprises a number of discrete signal pins, such as two pins, three pins, four pins, etc., although claimed subject matter is not limited in this respect. In other embodiments, clock extend signal 230 may comprise a serial bus, for example, rather than discrete signal pins, and claimed subject matter is intended to embrace use of a discrete number of signal pins as well as use of a serial bus to suppress rising edges and/or falling edges of clock signal 225.

In diagram 200, write enable signal 205 may be coupled to an inverting input of OR gate 210. Thus, in operation, when write enable signal 205 comprises a binary logic value of "0," an inverting input node of OR gate 210 may comprise a binary logic value of "1," which initiates counter 215 to count a number of clock cycles indicated by the one or more input signal pins of clock extend signal 230. As counter 215 successively increments counting, a binary logic value of "1" may be present at a non-inverting input port of OR gate 210. Accordingly, even if write enable signal 205 were to increase in amplitude so as to comprise a binary logic value of "1," (e.g., indicating a transition from a memory write operation to a memory read operation), an output signal from OR gate 210 may maintain a binary logic value of "1" until counter 215 increments to a desired number of clock cycles.

In addition, while counter 215 increments to a desired number of clock cycles, state device 240 may suspend coupling of clock signal 225 to OR gate 245 and, for example, to MRAM cell array 165. It should be noted that in diagram 200, clock signal 225 may be coupled to an inverting input of state device 240. Accordingly, when counter 215 increments to a desired number of clock cycles, state device 240 conveys a binary logic value of "1" for example, to OR gate 245, responsive to a falling edge of clock signal 225. A falling edge of clock signal 225 may also be conveyed from state device 240 to latch 250, which may operate to convey clock signal 225 to OR gate 245. Thus, in the embodiment of diagram 200, OR gate 245 may operate to merge clock signal 225, by way of latch 250, with clock signal 225 as clock signal 225 undergoes adjustment (e.g., extension) via state device 240 cooperating with counter 215 and OR gate 210.

Hence, in the embodiment of FIG. 2 (diagram 200) clock extend signals 230 may operate to provide a binary encoded integer number of clock cycles, which may permit extended write operations to MRAM cell array 165. In a particular embodiment, clock extend signals 230 may utilize two signal pins, cooperating with write enable signal 205, to provide a binary encoded integer number, substantially in accordance with Table I, below:

TABLE I

| Write Enable Signal 205 | Clock Extend Signal 230 [1:0] | Local Clock Signal 255 |
|---|---|---|
| 1 | X | 1 cycle (0.5 clk-high + 0.5 clk-low) |
| 0 | [0, 0] | 2 cycles (1.5 clk-high + 0.5 clk-low) |
| 0 | [0, 1] | 3 cycles (2.5 clk-high + 0.5 clk-low) |
| 0 | [1, 0] | 4 cycles (3.5 clk-high + 0.5 clk-low) |
| 0 | [1, 1] | 5 cycles (4.5 clk-high + 0.5 clk-low) |

Wherein when write enable signal 205 comprises a binary logic value of "1," this may represent a condition in which counter 215 may ignore clock extend signal 230. However, when write enable circuit comprises a binary logic value of "0" (indicating placement of the circuit of diagram 200 into a memory "write" mode) logic high/low signals at clock extend signals 230 may be utilized to adjust or extend at least a portion of clock signal 225. In Table I, clock extend signal 230 may be utilized to adjust or extend the "high" portion of a clock signal, while maintaining a constant "low" portion of the clock signal. However, claimed subject matter is not limited in this respect. It should also be noted that although the circuit of diagram 200 has been described within the context of adjusting a clock signal to perform write operations to MRAM cell array 165, in other embodiments, the circuit of diagram 200 may be adapted to perform read operations from SRAM cell array 155. Accordingly, claimed subject matter is intended to embrace circuits, such as the circuit of diagram 200, which may perform write operations to an MRAM cell array, as well as modifications of the circuit of diagram 200, which may assist in performing both read and write operations of dissimilar memory types, such as memory types comprising SRAM cell arrays and MRAM cell arrays.

Figure 3:
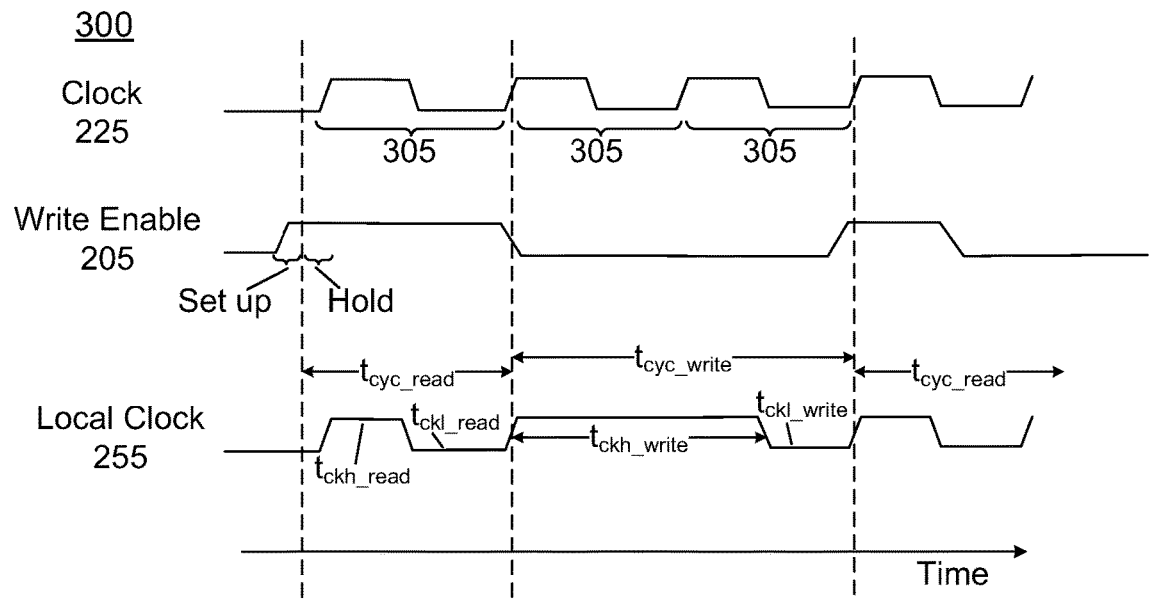
FIG. 3 is a timing diagram utilized by a circuit to adjust a clock signal during memory write operations according to various embodiments.

FIG. 3 is a timing diagram 300 utilized by a circuit to adjust a clock signal during memory write operations according to various embodiments. As shown in FIG. 3, clock signal 225 may comprise a number of cycles characterized by a rising edge followed by a falling edge over a duration 305. However, it should be noted that the waveform generated by clock signal 225 may comprise any convenient and substantially periodic waveform, and claimed subject matter is not limited in this respect. Timing diagram 300 also depicts write enable signal 205, which may comprise a brief "set up" period, followed by a brief "hold" period, during which write enable signal 205 may be sampled. In diagram 300, if write enable signal 205 comprises a relatively high value, such as to correspond to a binary logic value of "1," local clock signal 255 may closely track clock signal 225 ($t_{cyc\_read}$), including a high portion of the local clock signal ($t_{ckh\_read}$) and a low portion of the local clock signal ($t_{ckl\_read}$).

Responsive to write enable signal 205 comprising a relatively low signal level (e.g., to correspond to a binary logic value of "0"), which may indicate the initiation of a memory write operation, rising and/or falling edges of local clock signal 255 may be suppressed, so as to provide sufficient time to complete, for example, writing operations to cells of a MRAM array. Thus, as shown in FIG. 3, $t_{cyc\_write}$ may be adjusted (e.g., extended) to correspond to two cycles of clock signal 225. Accordingly as shown in FIG. 3, when write enable signal 205 comprises a binary logic value of "0," local clock signal 255 may comprise a relatively high signal level for approximately 1.5 clock cycles ($t_{cych\_write}$), followed by a relatively low signal level ($t_{cycl\_write}$) for approximately 0.5 clock cycles. It may be appreciated that write enable signal 205 may comprise such signal levels and durations responsive to binary logic values of "0" being applied to two pins [0, 0] of clock extend signal 230 of Table I. Following return of write enable signal to a binary logic value of "1," local clock signal 255 may again closely track clock signal 225.

It may be appreciated that the timing diagram of FIG. 3 may be suited for adjusting a clock signal during write operations, such as write operations of to MRAM cell array, according to particular embodiments. However, in certain other embodiments, write enable signal 205 comprising a relatively high signal may bring about placement of a circuit into a memory read mode, such as a mode suitable for reading from a SRAM cell array, such as SRAM cell array 155 of FIG. 1. As discussed previously herein, adjustment in a clock signal during SRAM read operations may be particularly useful for reading from SRAM cell arrays during instances of relatively low values of bit-line voltages, such as $V_{BIT}$ shown in FIG. 1.

Figure 4:
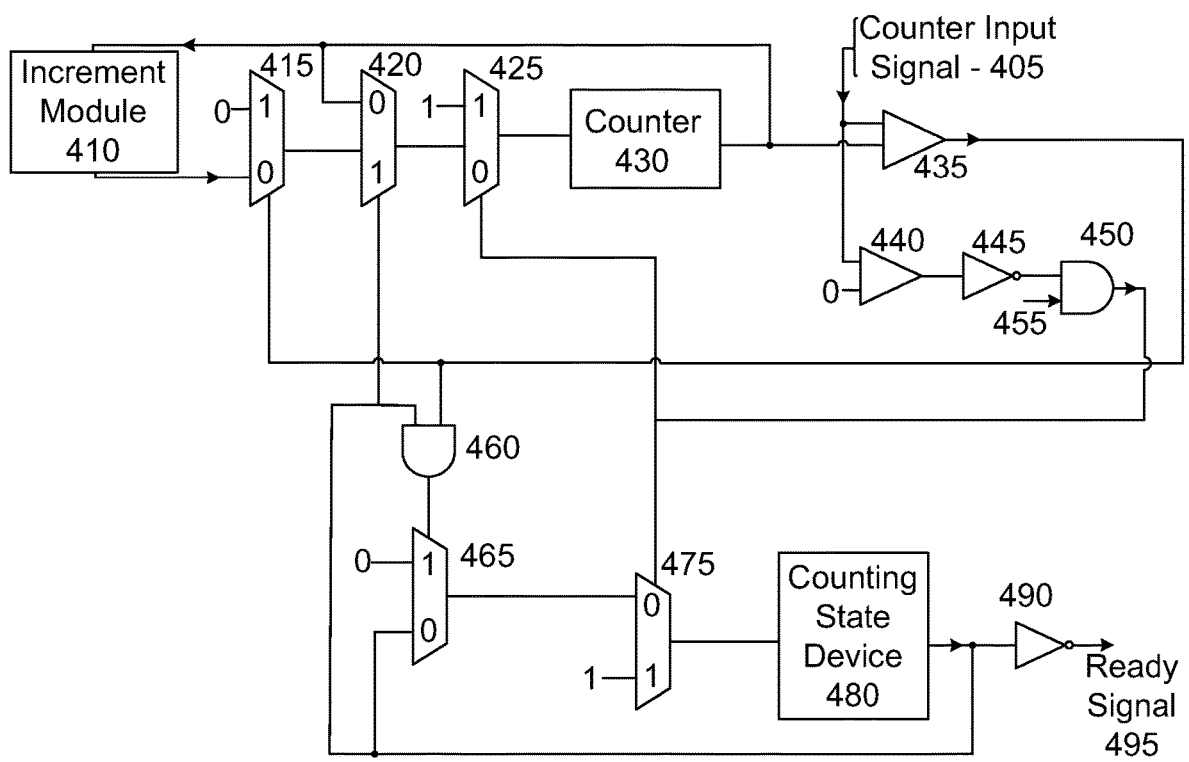
FIG. 4 is a logic diagram utilized by a circuit to adjust a clock signal during memory read operations according to various embodiments.

FIG. 4 is a logic diagram 400 utilized by a circuit to adjust a clock signal during read memory operations according to various embodiments. In embodiments, logic diagram 400, may be utilized in a circuit environment corresponding to a system-on-a-chip, wherein memory read operations are performed, such as read operations associated with reading from a SRAM cell array. Operation of a circuit implemented according to logic diagram 400 may be initiated responsive to receipt of counter input signal 405, which may comprise a value of, for example, between 1 and 16. In the embodiment of diagram 400, counter input signal 405 may comprise four discrete signal input pins, which may instruct counter 430 to suppress rising edges and/or falling edges of a clock input signal for up to 16 clock signal periods, although claimed subject matter is not limited in this respect. When a signal present at an output node of counter 430 is not equal to the value provided by counter input signal 405, comparator 435 provides a binary logic value of "0" to multiplexer 415 and to AND gate 460. Accordingly, multiplexer 415 may select an input node corresponding to an output of increment module 410.

Responsive to selection by multiplexer 415 of a signal from increment module 410, multiplexer 420 may select a signal input of either an output from increment module 410 or from an output signal from counting state device 480. In diagram 400, an output signal from counting state device 480, coupled to multiplexer 420, comprises either a binary logic value of "0" (to indicate that device 480 is currently not counting clock cycles) or a binary logic value of "1" (to indicate that device 480 is currently in the process of counting clock cycles). When counting state device 480 is in the process of counting clock cycles, counter 430 may be incremented via output signals from multiplexers 420 and 425. When counting state device 480 is not in the process of counting clock cycles, counter 430 may retain a present (unincremented) value.

Multiplexer 425 may operate to select between a binary logic value of "1" and an output signal from multiplexer 420. Selection between a binary logic value of "1" and the output signal from multiplexer 420 may occur responsive to an output signal from AND gate 450, which may operate to reset counting state device 480 by way of conveying an output signal to multiplexer 475. In logic diagram 400, such resetting of counting state device 480 may be brought about by conveying a binary logic value of "0" from multiplexer 475 to counting state device 480.

Comparator 440, which may operate in a manner similar to that of comparator 435, may operate to determine if counter input signal 405, which may be programmable by a user, equals binary logic value of "0." If counter input signal 405 does not, an output of inverting gate 445 may comprise a binary logic value of "0." Responsive to a binary logic value of "0" present at an output of inverting gate 445 and a binary logic value of "1" present at input node 455 of AND gate 450 (which may indicate a desire to start a clock delay operation), AND gate 450 may initiate counting by conveying a binary logic value of "0" to multiplexer 475. When a binary logic value of "0" is not present at an output of inverting gate 445, this implies that a memory read operation is not occurring. AND gate of 450 may perform a checking operation to set an input node of counting state device 480 to a binary logic value of "1" state, which may change the state of counting of device 480 (e.g., from a "not counting" state to a "counting" state). When counting state device 480 comprises a "counting" state, a binary logic value of "1" may be conveyed through inverter 490 to provide ready signal 495. In diagram 400, ready signal 495 may be coupled to a memory bus, such as a memory bus of a system-on-a-chip, to indicate that a SRAM read operation is being conducted. An output of AND gate 450 may also be utilized to reset counter 430 by conveying a binary logic value of "1" to multiplexer 425.

Multiplexer 465 comprises two input nodes and an output node that operates to reset counting state device 480 via multiplexer 475, such as by conveying a binary logic value of "0" to counting state device 480. In diagram 400, an output node of counting state device 480 may be set to a binary logic value of "0" when counter input signal 405 is set to a binary logic value of "1" and when an output node of AND gate 450 is set to a binary logic value of "1." When these two conditions are not met (e.g., either counter input signal 405 is set to a binary logic value of "0" or when output node of AND gate 450 is set to a binary logic value of "0") counting state device 480 may retain its current value unless an output node of multiplexer 475 is set to a binary logic value of "1." Multiplexer 475 comprises two input nodes, which set counting state device 480 to a "counting" state (wherein a counting state may be indicated via a binary logic value of "1" present at an output node of counting state device 480) when an output node of AND gate 450 comprises a binary logic value of "1."

Accordingly, implementation of the logic set forth in diagram 400 provides a method of suspending operations of a communications bus via maintaining ready signal 495 in a binary logic state of "0." Via suspension of bus operations while ready signal 495 comprises a binary logic value of "0," an SRAM read operation, such as an operation involving SRAM cell array 155 of FIG. 1, may be permitted to run to completion. As previously discussed herein, such suspension of bus operations may be useful especially during operations involving SRAM cell arrays in which $V_{BIT}$ may comprise lower voltages, such as 0.3 V or 0.4 V, for example, or even somewhat higher voltages, such as 0.6 V or 0.7 V, for example.

Figure 5:
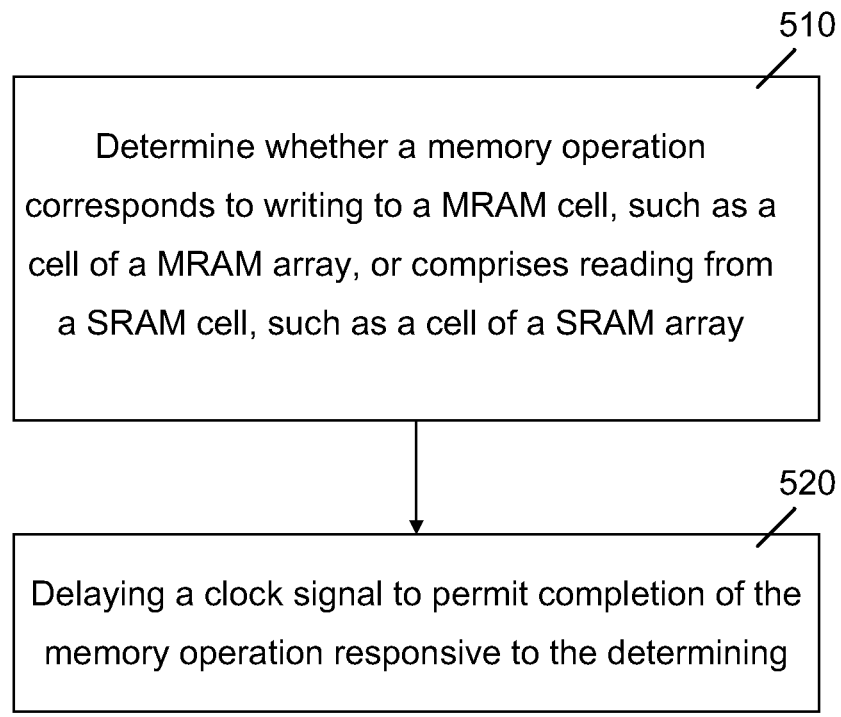
FIG. 5 is a flow chart for a method of adjusting the clock signal during memory read operations and/or memory write operations according to various embodiments.

FIG. 5 is a flow chart for a method 500 of adjustment of clock signals during memory read operations and/or memory write operations according to various embodiments. FIG. 5 may include blocks in addition to those shown and described, fewer blocks or blocks occurring in an order different than may be identified, or any combination thereof. Method 500 may begin at block 510, which may comprise determining whether a memory operation corresponds to writing to a MRAM cell, such as a cell of a MRAM array, or comprises reading from a SRAM cell, such as a cell of a SRAM array. A MRAM array referenced at block 510 may comprise an array of STT MRAM elements, such as MRAM cell array 165 of FIG. 1. A SRAM array referenced at block 510 may comprise an array of six-transistor SRAM cells, such as SRAM cell array 155 of FIG. 1.

In particular embodiments, determining whether the memory operation corresponds to a writing operation or to a reading operation may be dependent upon the state of a write enable signal, such as write enable signal 105 of FIG. 1, or write enable signal 205 of FIG. 2. In certain embodiments, determining whether the memory operation corresponds to a writing operation or a reading operation may be dependent on a counter input signal, such as counter input signal 405 of FIG. 4, which may bring about a delay of a bus transfer ready signal, such as ready signal 495 also of FIG. 4. As described with reference to FIG. 4, ready signal 495 may delay operations, such as memory bus operations, to permit completion of SRAM read operations, for example.

In other embodiments, block 510 may comprise determining whether the memory operation corresponds to writing to a first memory type or reading from a second memory type, wherein the first memory type and the second memory type are dissimilar from each other. In certain embodiments, six-transistor cells of a SRAM array may represent a memory type that is dissimilar from cells of a MRAM array, for example.

Method 500 may continue at block 520, which may comprise delaying a clock signal to permit completion of the memory operation responsive to the determining. Accordingly, at least in particular embodiments, block 520 may comprise maintaining a memory bus ready signal, such as ready signal 495 of FIG. 4, to permit completion of a SRAM read operations prior to conducting subsequent bus operations. In certain embodiments, block 520 may comprise delaying rising and/or falling edges of a clock signal, for example, to permit completion of MRAM write operations prior to conducting subsequent memory operations.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. For example, various combinations of the features of the dependent claims could be made with the features of the independent claims without departing from the scope of the present invention.

What is claimed is:

1. A circuit, comprising:
    a first memory cell and a second memory cell; and
    a clock-delay component having an output node coupled to the first memory cell and to the second memory cell, wherein the clock-delay component is configured to receive an input clock, provide adjusted clock signals to the first memory cell derived from the input clock during writing to the first memory cell, and provide the adjusted clock signals to the second memory cell derived from the input clock during reading from the second memory cell,
    wherein the first memory cell refers to a magnetic random-access memory (MRAM) cell, and wherein the second memory cell refers to a static RAM (SRAM) cell.

2. The circuit of claim 1, wherein the MRAM cell comprises a spin-transfer torque (STT) device.

3. The circuit of claim 1, further comprising a voltage sensor configured to determine that a voltage at an input node of the second memory type is less than a threshold voltage.

4. A circuit, comprising:
a first memory cell;
a second memory cell that is dissimilar to the second memory cell;
a clock-delay component having an output node coupled to the first memory cell and the second memory cell, wherein the clock-delay component is configured to adjust clock signals during writing to the first memory cell and adjust clock signals during reading from the second memory cell; and
a temperature sensor to increase a clock-delay duration responsive to the temperature sensor measuring a temperature lower than a threshold value, wherein the temperature sensor has an output signal port coupled to an input port of the clock-delay component.

5. A circuit, comprising:
a first memory cell;
a second memory cell that is dissimilar to the second memory cell; and
a clock-delay component having an output node coupled to the first memory cell and the second memory cell, wherein the clock-delay component is configured to adjust clock signals during writing to the first memory cell and adjust clock signals during reading from the second memory cell,
wherein the clock-delay component is configured to provide an output signal to delay the clock signals during reading from the second memory cell.

6. A circuit, comprising:
a first memory cell;
a second memory cell that is dissimilar to the second memory cell; and
a clock-delay component having an output node coupled to the first memory cell and the second memory cell, wherein the clock-delay component is configured to adjust clock signals during writing to the first memory cell and adjust clock signals during reading from the second memory cell,
wherein the clock-delay component is configured to provide an output signal to delay the clock signals during writing to the first memory cell by two or more clock periods derived from a clock input node the circuit.

7. The circuit of claim 6, further comprising one or more control signal inputs configured to set the delay of the clock signals during to writing to the first memory cell.

8. A circuit, comprising:
a first memory cell;
a second memory cell that is dissimilar to the second memory cell;
a clock-delay component having an output node coupled to the first memory cell and the second memory cell, wherein the clock-delay component is configured to adjust clock signals during writing to the first memory cell and adjust clock signals during reading from the second memory cell; and
one or more control signal inputs configured to set the delay of the clock signals during reading from the second memory cell.

9. A circuit, comprising:
a clock-delay component having an input node coupled to a temperature sensor and an output node coupled to a magnetic random-access memory (MRAM) cell,
wherein the clock-delay component is configured to adjust a clock signal and the clock signal is configured to permit completion of a writing operation to the MRAM cell, and
wherein the clock-delay component obtains a signal from the temperature sensor to indicate when a temperature of the MRAM cell changes with respect to a threshold.

10. The circuit of claim 9, wherein the threshold refers to a lower threshold, and wherein the clock-delay component uses the input node to obtain the signal from the temperature sensor to indicate when the temperature of the MRAM cell is less than the lower threshold.

11. The circuit of claim 9, wherein the clock-delay component comprises an input node to dynamically increment the adjustment of the clock signal.

12. The circuit of claim 11, wherein the threshold refers to an upper threshold, and wherein the input node to dynamically increment the adjustment of the clock signal is configured to receive the signal from the temperature sensor to indicate when the temperature of the MRAM cell is greater than the upper threshold.

13. The circuit of claim 9, wherein the MRAM cell comprises a spin-transfer torque (STT) device.

14. A circuit, comprising:
a clock-delay component having an output node coupled to a magnetic random-access memory (MRAM) cell, wherein the clock-delay component is configured to adjust a clock signal, and wherein the clock signal is configured to permit completion of a writing operation to the MRAM cell; and
a second clock-delay component having an output node coupled to a static RAM (SRAM) memory cell, wherein the second clock-delay component is configured to permit completion of a reading operation from the SRAM memory cell.

15. A method of performing a memory operation, comprising:
providing a magnetic random-access memory (MRAM) cell and a static random-access memory (SRAM) cell;
receiving clock signals at an input node;
determining whether the memory operation corresponds to writing to the MRAM cell or reading from the SRAM cell; and
adjusting the clock signals by delaying the clock signals to an output node coupled to the MRAM cell and the SRAM cell so as to permit completion of the memory operation responsive to the determining.

16. A method of performing a memory operation, comprising:
determining whether the memory operation corresponds to writing to a magnetic random-access memory (MRAM) cell or reading from a static random-access memory (SRAM) cell;
delaying a clock signal to permit completion of the memory operation responsive to the determining; and
obtaining a signal from a temperature sensor and determining a delay increment of the clock signal responsive to determining that the memory operation corresponds to writing to the MRAM cell.

17. A method of performing a memory operation, comprising:
determining whether the memory operation corresponds to writing to a magnetic random-access memory (MRAM) cell or reading from a static random-access memory (SRAM) cell;
delaying a clock signal to permit completion of the memory operation responsive to the determining;

determining a delay increment of the clock signal responsive to determining that the memory operation corresponds to reading from the SRAM cell; and determining that a bit cell access voltage is lower than a threshold value.

18. A method of performing a memory operation, comprising:

determining whether the memory operation corresponds to writing to a magnetic random-access memory (MRAM) cell or reading from a static random-access memory (SRAM) cell;

delaying a clock signal to permit completion of the memory operation responsive to the determining;

obtaining a signal from an error detection circuit, the signal from the error detection circuit to indicate that a previous writing operation to the MRAM cell has failed; and incrementing a delay of a subsequent clock signal responsive to the indication that the previous writing operation to the MRAM cell has failed.

* * * * *